US 7,015,144 B2

(12) United States Patent
Hong et al.

(10) Patent No.: US 7,015,144 B2
(45) Date of Patent: Mar. 21, 2006

(54) COMPOSITIONS INCLUDING PERHYDRO-POLYSILAZANE USED IN A SEMICONDUCTOR MANUFACTURING PROCESS AND METHODS OF MANUFACTURING SEMICONDUCTOR DEVICES USING THE SAME

(75) Inventors: Eunkee Hong, Gyeonggi-do (KR); Kyutae Na, Gyeonggi-do (KR); Juseon Goo, Gyeonggi-do (KR); Hong Gun Kim, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 130 days.

(21) Appl. No.: 10/776,823

(22) Filed: Feb. 11, 2004

(65) Prior Publication Data

US 2004/0161944 A1  Aug. 19, 2004

(30) Foreign Application Priority Data

Feb. 12, 2003  (KR) ............. 10-2003-0008846

(51) Int. Cl.
*H01L 21/311* (2006.01)
*H01L 21/31* (2006.01)
*H01L 21/469* (2006.01)

(52) U.S. Cl. ............. 438/694; 438/758; 438/759; 438/787; 438/789; 438/790

(58) Field of Classification Search ........... 438/694, 438/758, 789
See application file for complete search history.

(56) References Cited

U.S. PATENT DOCUMENTS

| 5,885,654 | A | * | 3/1999 | Hagiwara et al. | 427/226 |
|---|---|---|---|---|---|
| 6,204,161 | B1 | * | 3/2001 | Chung et al. | 438/612 |
| 6,340,641 | B1 | | 1/2002 | Muraguchi et al. | |
| 6,376,911 | B1 | * | 4/2002 | Ryan et al. | 257/752 |
| 6,706,646 | B1 | * | 3/2004 | Lee et al. | 438/782 |
| 6,762,126 | B1 | * | 7/2004 | Cho et al. | 438/694 |
| 6,869,860 | B1 | * | 3/2005 | Belyansky et al. | 438/435 |
| 6,878,463 | B1 | * | 4/2005 | Skrobis | 428/630 |
| 2002/0160614 | A1 | | 10/2002 | Cho et al. | 438/694 |
| 2003/0040194 | A1 | | 2/2003 | Lee et al. | |

FOREIGN PATENT DOCUMENTS

| EP | 1278238 A1 | | 1/2003 |
|---|---|---|---|
| JP | 6-16410 | * | 6/1994 |
| JP | 2001-308090 | | 11/2001 |
| JP | 2002-301429 | * | 10/2002 |
| JP | 2002308090 | | 11/2002 |
| KR | 2001-0100749 A | | 11/2001 |
| KR | 10-2002-0068672 | | 8/2002 |

(Continued)

OTHER PUBLICATIONS

Jung-Ho Lee et al. , A study of ILD Process of simple amd CMP Skip using Polysilazane-based SOG, IEEE, 2001, 317-320.*

(Continued)

*Primary Examiner*—Long Pham
*Assistant Examiner*—Shrinivas H. Rao
(74) *Attorney, Agent, or Firm*—Myers Bigel Sibley & Sajovec

(57) ABSTRACT

Compositions that can be used in semiconductor manufacturing processes, comprising perhydro-polysilazane having a weight average molecular weight of about 300 to about 3,000 and a polydispersity index of about 1.8 to about 3.0 are provided. Solutions comprising the compositions of the present invention, methods of forming films in a semiconductor manufacturing process, and methods of manufacturing semiconductor devices are also provided.

17 Claims, 18 Drawing Sheets

FOREIGN PATENT DOCUMENTS

KR   2002-0068672   8/2002

OTHER PUBLICATIONS

Jung-Sik Choi etal., "A Shallow Trench Isolation using Novel Polysilizane-based SOG for Deep-Submicron Technologies and Beyond" IEEE 2003, 419-422.*

Tsubaki Junlchiro, "Development of ceramic Nano-porous Materials" 2002, 167-170.*

Tsali Cross et al. "Fabrication Process for Ultra High Aspect ratio Polysilazane- Dervied MEMS " IEEE, 2002, 172-175.*

* cited by examiner

COMPOSITIONS INCLUDING PERHYDRO-POLYSILAZANE USED IN A SEMICONDUCTOR MANUFACTURING PROCESS AND METHODS OF MANUFACTURING SEMICONDUCTOR DEVICES USING THE SAME

CROSS REFERENCE TO RELATED APPLICATIONS

This application claims priority under 35 U.S.C. § 119 to Korean Patent Application No. 2003-8846, filed on Feb. 12, 2003, the disclosure of which is incorporated herein by reference in its entirety.

FIELD OF THE INVENTION

The present invention relates to compositions including perhydro-polysilazane used in semiconductor manufacturing processes and methods of manufacturing semiconductors using the same. More particularly, the present invention relates to compositions including perhydro-polysilazane used in semiconductor manufacturing processes to form a dense and uniform film, and methods of manufacturing semiconductor devices using the compositions.

BACKGROUND OF THE INVENTION

The design of semiconductor devices has experienced rapid progress in accordance with the wide use of information process apparatuses such as computers. This progress has lead to the development of semiconductor devices that can function at high operating speeds and that have large storage capacities. In order to satisfy such requirements, semiconductor devices with increased density, reliability and response time are under development. Thus, the size of all kinds of patterns formed on the semiconductor devices is reduced, and the size of gaps in the patterns greatly decreases.

Generally, because various conductive patterns are formed on a silicon substrate in the semiconductor manufacturing process as transistors and various metal wirings, insulation films are interposed between the conductive patterns. The insulation film is formed on the substrate to cover the conductive patterns, and then is planarized to fill gaps between the conductive patterns. This planarizing process becomes more important in order to completely fill the gaps between the conductive patterns with the insulation film.

Boro-phosphor silicate glass (BPSG) is widely employed to form the insulation film because BPSG may fill the gap between the patterns, and may have a level surface by thermally treating the BPSG after deposition of BPSG on the substrate. However, BPSG may not be easily employed because a high temperature reflow process is required in order for the deposition of BPSG to fill the gap between the patterns. Furthermore, the etching rate of BPSG is too rapid so that the insulation film composed of BPSG has little significant thickness.

To form an insulation film on a semiconductor substrate, there are processes that utilize high-density plasma chemical vapor deposition (HPD-CVD) oxide and ozone-tetra ethyl ortho silicate ($O_3$-TEOS). HDP-CVD oxide and $O_3$-TEOS are widely employed for a shallow trench isolation (STI) process or a pre-metallic dielectric (PMD) process to fabricate a semiconductor device having a design rule of below about 100 nm. However, HDP-CVD oxide and $O_3$-TEOS may not fill up a gap between patterns formed on a substrate.

Flowing type spin on glass (SOG) is used for forming an insulation film because SOG fills gaps between patterns to thereby prevent voids from forming in the insulation film. As for the process for forming the insulation film using SOG, a polysilazane-based material is coated on a substrate including the patterns by a spin coating process and the, polysilazane-based material is changed to a silicon oxide ($SiO_2$) film by a hardening process in which oxygen ($O_2$) gas and water ($H_2O$) vapor are provided at high temperatures. Thus, when the process for forming the insulation film is performed using the polysilazane-based material, the cost of the process may be reduced. This silicon oxide film made from the polysilazane-based material is thermally and chemically stable in comparison with a conventional SOG film so that the silicon oxide film of the polysilazane-based material is effectively used as a shallow trench isolation (STI) film and an interlayer insulation film in a semiconductor manufacturing process. Japanese Laid-Open Patent Publication No. 2001-308090 and Korean Laid-Open Patent Publication No. 2002-68672 propose methods of filling a gap between patterns using polysilazane. However, the above-mentioned polysilazane compositions have a high weight average molecular weight (greater than about 3,000). Although polysilazane having weight average molecular weight of about 5,000 may be used to fill gaps between patterns, the resulting insulation film of this polysilazane may be porous when this polysilazane of high molecular weight is employed in a semiconductor device having a design rule of below about 20 nm. Polysilazane having weight average molecular weight of about 5,000 typically has an average molecular size of about 4 nm. Voids may be formed in the insulation film when gaps between the patterns are filled with polysilazane having the average molecular size of about 4 nm. Thus, when the insulation film of polysilazane having high molecular weight is etched and cleaned to form contact holes therein, undesired portions of the insulation film might be etched, yielding contact holes that are connected to each other. As a result, failure of a semiconductor device may occur due to electric short between contacts formed in the connected contact holes.

SUMMARY OF THE INVENTION

Embodiments of the invention can provide compositions including perhydro-polysilazane of a low molecular weight to completely fill a gap between conductive patterns formed on a substrate.

Other embodiments of the invention can provide methods of forming a film using compositions including perhydro-polysilazane of a low molecular weight to thereby completely fill a gap between conductive patterns formed on a substrate.

Further embodiments of the invention can provide methods of manufacturing semiconductor devices including a dense and uniform insulation film using compositions including perhydro-polysilazane of low molecular weight.

In some embodiments of the present invention, compositions used in semiconductor manufacturing processes are provided. The compositions comprise perhydro-polysilazane having a weight average molecular weight of about 300 to about 3,000 and a polydispersity index (the ratio of weight average molecular weight and number average molecular weight, $M_w/M_n$, or molecular weight distribution) of about 1.8 to about 3.0 according to the formula:

wherein n is a positive integer.

In other embodiments of the invention, compositions are provided in a solution, wherein the solution comprises about 5 to about 30 percent by weight of perhydro-polysilazane, and about 70 to about 95 percent by weight of a solvent such as xylene or dibutyl ether.

In yet other embodiments of the present invention, methods of forming films using the above-described compositions and solutions are provided. Here, the films are formed using a spin coating process, and the films are changed into silicon oxide films by heating the films and by providing an oxidizing gas to the films.

In still other embodiments of the present invention, methods of manufacturing semiconductor devices are provided. After first conductive patterns are formed on a substrate where an active region and a field region are defined, a first film can be formed on the substrate to fill gaps between the first conductive patterns using a solution that comprises the above-mentioned solvent and perhydro-polysilazane. A first silicon oxide film can be formed from the first film by heating the first film and providing a first oxidizing gas to the first film, and then a first opening exposing the active region can be formed by partially etching the first silicon oxide film. Finally, a first contact can be formed in the first opening by filling the first opening with a conductive material.

According to embodiments of the present invention, a semiconductor device can be manufactured using compositions including perhydro-polysilazane of a low molecular weight having a weight average molecular weight of about 300 to about 3,000 and polydispersity index of about 1.8 to about 3.0. Thus, a dense and uniform film of the semiconductor device can be formed using the compositions including perhydro-polysilazane having low molecular weight and small molecular weight distribution. When this film is employed for an interlayer insulation film of the semiconductor device, the interlayer insulation film is not etched during a cleaning process so that contact holes formed through the interlayer insulation film are completely separated from each other. As a result, contact plugs formed in the contact holes are completely insulated, thereby improving the reliability of the semiconductor device.

BRIEF DESCRIPTION OF THE DRAWINGS

The above and other embodiments of the present invention will become readily apparent by reference to the following detailed description when considered in conjunction with the accompanying drawings wherein.

DETAILED DESCRIPTION OF THE INVENTION

Figure 1A:
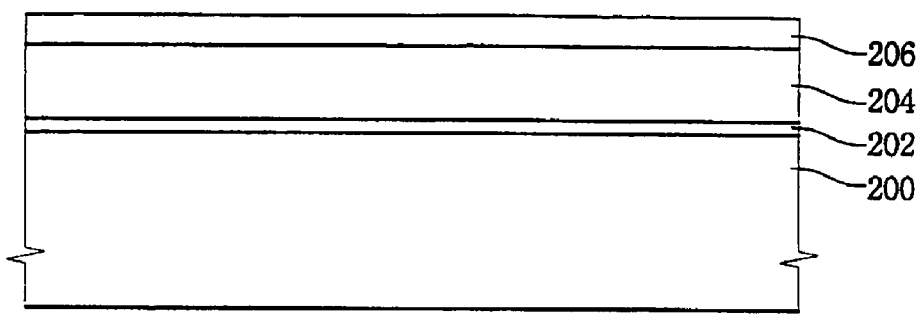
FIGS. 1A to 1E are cross sectional views illustrating a method of forming a field oxide film in a trench of a semiconductor substrate according to one embodiment of the present invention.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

In the drawings, the size or thickness of layers and regions are exaggerated for clarity. Like reference numerals refer to like elements throughout. As used herein, the singular forms "a," "an" and "the" are intended to include the plural forms as well, unless the content clearly indicates otherwise.

Unless otherwise defined, all technical and scientific terms used herein have the same meaning as commonly understood by one of ordinary skill in the art to which the invention belongs. All publications, patent applications, patents and other references mentioned herein are incorporated herein by reference in their entirety.

It will be understood that although the terms "first," "second" and "third" may be used herein to describe various patterns, regions, layers, and/or sections, these patterns, regions, layers, and/or sections should not be limited by these terms. These terms are only used to distinguish one region, layer, or section from another region, layer, or section. Thus, a first region, layer, or section discussed below could be termed a second region, layer, or section, and similarly, a third without departing from the teachings of the present invention.

It will also be understood that when a layer is referred to as being "on" another layer or substrate, it can be directly on the other layer or substrate, or intervening layers may also be present.

The perhydro-polysilazane of the present invention has low molecular weight. In some embodiments, the compositions of the present invention comprise perhydro-polysilazane having a weight average molecular weight of about 300 to about 3,000 and a polydispersity index (the ratio of weight average molecular weight to number average molecular weight, $M_w/M_n$, or molecular weight distribution) of about 1.8 to about 3.0. When the pehydro-polysilazane of the present invention is described as having "low molecular weight" herein, it is defined as having the weight average molecular weight and polydispersity index as described. When a perhydro-polysilazane is described as having "high molecular weight" herein, it is defined as having a weight average molecular weight of above about 3,000. In some embodiments, the weight average molecular weight is above 5,000. Perhydro-polysilazane of the present invention has the formula;

wherein n indicates a positive integer.

When perhydro-polysilazane has a weight average molecular weight of below about 300, perhydro-polysilazane may not have characteristics of a high molecular weight substance. Furthermore, when perhydro-polysilazane has a weight average molecular weight of above about 3,000, the average molecular size of the perhydro-polysilazane is such that perhydro-polysilazane of high molecular weight may not be employed for a thin film of a semiconductor device. Thus, in some embodiments, perhydro-polysilazane of the present invention has a weight average molecular weight of about 300 to about 3,000.

Meanwhile, when perhydro-polysilazane has a polydispersity index of below about 1.8, the porosity of perhydro-polysilazane molecules increases to generate pores or voids in a film of perhydro-polysilazane because the molecular weight distribution of perhydro-polysilazane becomes relatively uniform. However, when perhydro-polysilazane has a polydispersity index of above about 3.0, the film of perhydro-polysilazane has deteriorated uniformity although the porosity of perhydro-polysilazane molecules decreases. Therefore, in some embodiments, the perhydro-polysilazane of the present invention has a polydispersity index of about 1.8 to about 3.0.

Furthermore, the perhydro-polysilazane of low molecular weight of the present invention can have a small molecular size. The average molecular size of the perhydro-polysilazane enables it to effectively fill gaps between conductive patterns on a semiconductor substrate below about 20 nm. In another embodiment, the average molecular size of the perhydro-polysilazane is below about 4 nm, and preferably about 2 nm.

According to embodiments of the present invention, compositions employed in semiconductor manufacturing processes are provided as a solution that comprises perhydro-polysilazane and a solvent. In yet other embodiments, the solution of the present invention comprises about 5 to about 30 percent by weight pehydro-polysilazane and about 70 to about 95 percent by weight solvent. Examples of the solvent include, but are not limited to, xylene and dibutyl ether.

When the solution comprises below about 5 percent by weight perhydro-polysilazane and above 95 percent by weight solvent, the solution may have insufficient viscosity for preparing a film. However, when the composition comprises above about 30 percent by weight perhydro-polysilazane and below 70 percent by weight solvent, the solution may be too viscous for preparing a film. Thus, in some embodiments, the solution of the present invention comprises about 5 to about 30 percent by weight of perhydro-polysilazane and comprises about 70 to 95 percent by weight solvent.

In other embodiments, the above-described compositions and solutions are employed in semiconductor manufacturing processes in which a semiconductor substrate is coated with the composition and solution. In some embodiments, a spin coating process to thereby form a film on the substrate can be employed. In still other embodiments, the film can be hardened by heating and providing an oxidizing gas such as an oxygen gas and a water vapor to the film. Heating may be performed at a temperature above about 600° C. In some embodiments, heating may be performed at a temperature of about 700° C. After forming the film, defects such as impurities or particles on the film may be measured using a conventional optical inspection apparatus.

Having described various embodiments of the invention, the same will be illustrated with reference to the following examples, which are included herein for illustrative purposes only, and which are not meant to be limiting of the invention.

EXAMPLE 1

A composition for manufacturing a semiconductor device was prepared to include perhydro-polysilazane having a weight average molecular weight ($M_w$) of about 1,800, a number average molecular weight ($M_n$) of about 800 and a polydispersity index ($M_w/M_n$, or molecular weight distribution) of about 2.2. The molecules of perhydro-polysilazane had an average molecular size of about 2 nm and a size range of about 0.5 to about 4 nm. A solution was prepared by mixing perhydro-polysilazane with a solvent of dibutyl ether. The solution included was about 14 percent by weight perhydro-polysilazane. The viscosity of the solution was about 1 cP. After the solution was coated on a substrate, the coated solution was hardened by providing an oxidizing gas to the coated solution, thereby forming an insulation film on the substrate. Here, the volume of the insulation film was shrunk by about 19 percent relative to the initial volume of the coated solution. The insulation film had a dielectric constant of about 4.0.

COMPARATIVE EXAMPLE 1

A composition for manufacturing a semiconductor device was prepared to include perhydro-polysilazane having a weight average molecular weight ($M_w$) of about 5,100, a number average molecular weight ($M_n$) of about 1,560 and a polydispersity index of about 3.1. The molecules of perhydro-polysilazane had an average molecular size of about 4 nm and a size range of about 0.7 to about 7 nm. A solution was prepared by mixing perhydro-polysilazane with a solvent of dibutyl ether. The solution included was about 12 percent by weight of perhydro-polysilazane. Here, the viscosity of the solution was about 1 cP. After the solution was coated on a substrate, the coated solution was hardened by providing an oxidizing gas to the coated solution, thereby forming an insulation film on the substrate. The volume of the insulation film was shrunk by about 20 percent relative to the initial volume of the coated solution. The insulation film had a dielectric constant of about 3.9.

The insulation films of Example 1 and Comparative Example 1 had substantially identical thickness of about 3,000 Å, although the insulation films were formed using the solutions included by different weight percent of perhydro-polysilazane. Furthermore, the insulation films had the substantially identical properties such as the viscosity of about 1 cP, the volume shrinkage of about 19 and 20 percent, and the dielectric constant of about 4.0 and 3.9.

However, upon examination with the optical inspection apparatus, scores to hundreds of defects were detected on the insulation film of Example 1 while hundreds to thousands of defects were measured on the insulation film of comparative Example 1. The number of the measured defects on the insulation film of Example 1 was less than about 10 percent of that of the insulation film of Comparative Example 1.

EXAMPLE 2

FIGS. 1A to 1E are cross sectional views illustrating a method of forming an oxide film in a trench of a semiconductor device according to the embodiments of the present invention.

Referring to FIG. 1A, after a pad oxide film 202 was formed on a silicon substrate 200, a first nitride film 204 and a high temperature oxide (HTO) film 206 were sequentially formed on the pad oxide film 202.

Figure 1B:
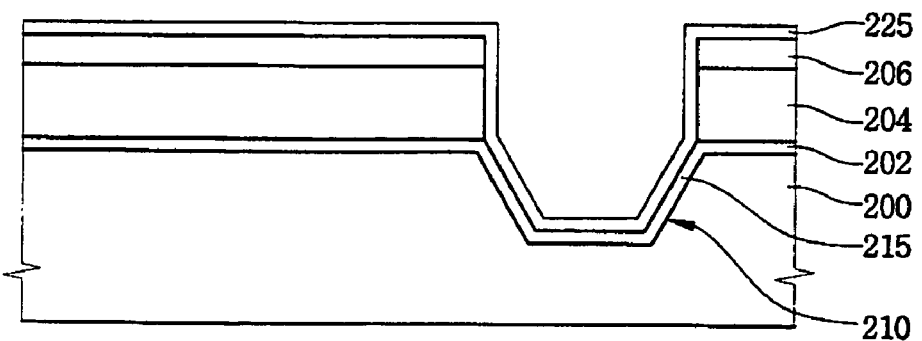

Referring to FIG. 1B, after a photoresist pattern (not shown) was formed on the HTO film 206, a trench 210 was formed by successively etching the HTO film, 206, the first nitride film 204, the pad oxide film 202 and the substrate 200. Thus, an etched portion of the silicon substrate 200 was exposed through the trench 210. In addition, there were also exposed sidewalls of the pad oxide film 202, the first nitride film 204 and the HTO film 206.

An inner oxide film 215 was formed in the trench 210 by thermally treating the exposed portion of the silicon substrate 200 under an oxygen atmosphere. That is, the inner oxide film 215 was formed on a bottom face and on an inner sidewall of the trench 210 by reacting an oxygen gas with silicon contained in the substrate 200.

A second nitride film 225 was formed on the inner oxide film 215 and on the HTO film 206. The second nitride film 225 was also formed on the exposed sidewalls of the pad oxide film 202, the first nitride film 204 and the HTO film 206.

Figure 1C:
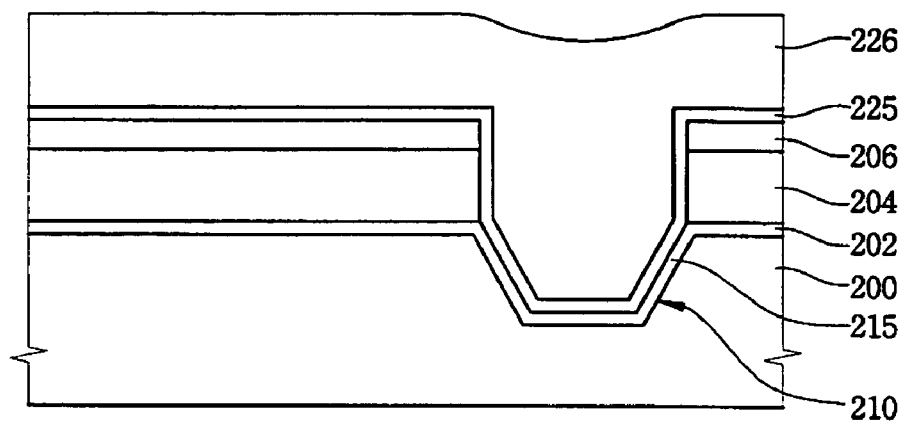

Referring to FIG. 1C, a first film 226 was formed on the second nitride film 225 to fill up the trench 210 using a solution according to the embodiments of the invention, the solution including perhydro-polysilazane and dibutyl ether, by a spin coating process.

Figure 1D:
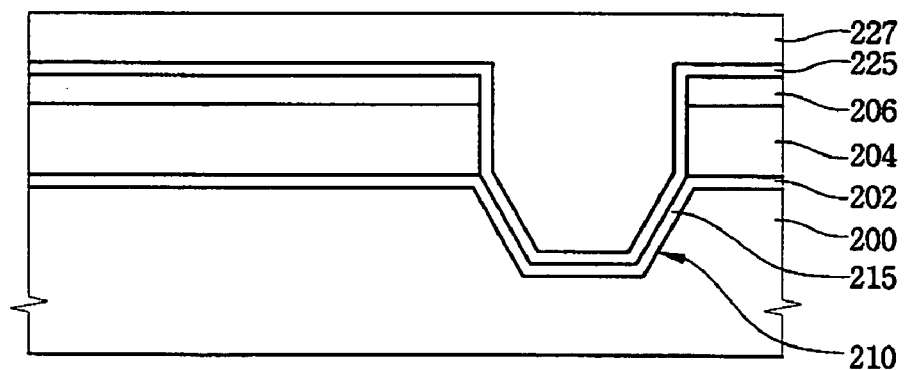

Referring to FIG. 1D, the first film 226 was changed into a first oxide film 227 by hardening the first film 226 while an oxidizing gas such as an oxygen ($O_2$) gas and a water vapor ($H_2O$) was provided to the first film 226. Here, the first film 226 was diminished during the hardening so that the first oxide film 227 had a reduced height over the substrate 200. Hence, a construction of the first oxide film 227 was dense.

Figure 1E:
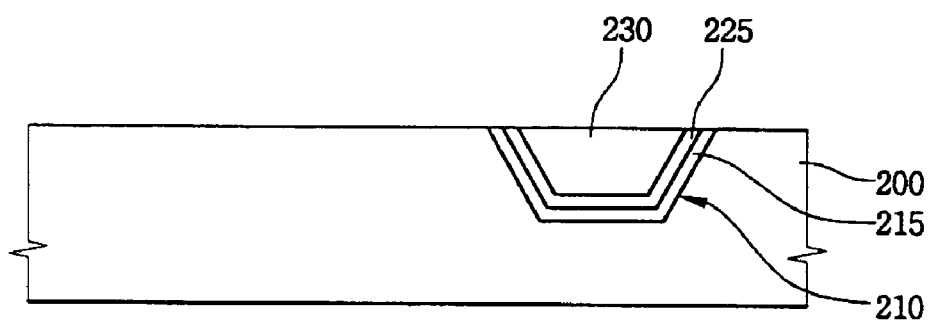

Referring to FIG. 1E, an etch back process was carried out to sequentially remove the first oxide film 227, a portion of the second nitride film 225 that is formed the substrate 200 except inside the trench 210, the HTO film 206 and the first nitride film 204 so that the first oxide film 227 remained only in the trench 210. As a result, a trench oxide film 230 is formed in the trench 210. Then, the pad oxide film 202 was removed from the substrate 200.

Figure 2A:
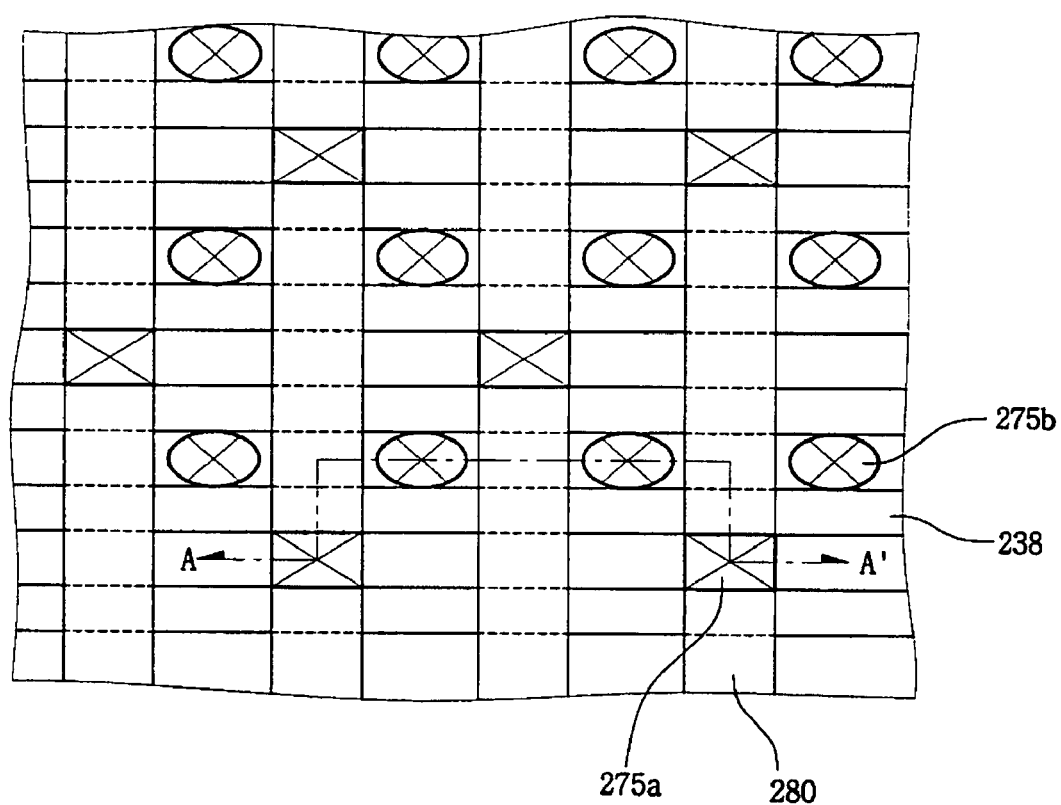
FIG. 2A is a plan view illustrating a semiconductor device manufactured by a method described in FIGS. 1A to 1E.

FIG. 2A is a plan view illustrating a semiconductor device manufactured by the method described in FIGS. 1A to 1E.

Referring to FIG. 2A, a semiconductor device of the present invention included a gate line (gate electrodes) 238 disposed along a first direction, and a bit line 280 disposed along a second direction perpendicular to the first direction. The bit line 280 included a bit line contact (a first contact plug) 275a that electrically connected the bit line 280 to a first underlying contact region of a semiconductor substrate. Additionally, a second contact plug 275b was formed so as to electrically connect a capacitor to a second underlying contact region of the semiconductor substrate.

FIGS. 2B to 2J are cross sectional views illustrating a method of forming the semiconductor device taken along the line of A–A' in FIG. 2A.

Figure 2B:
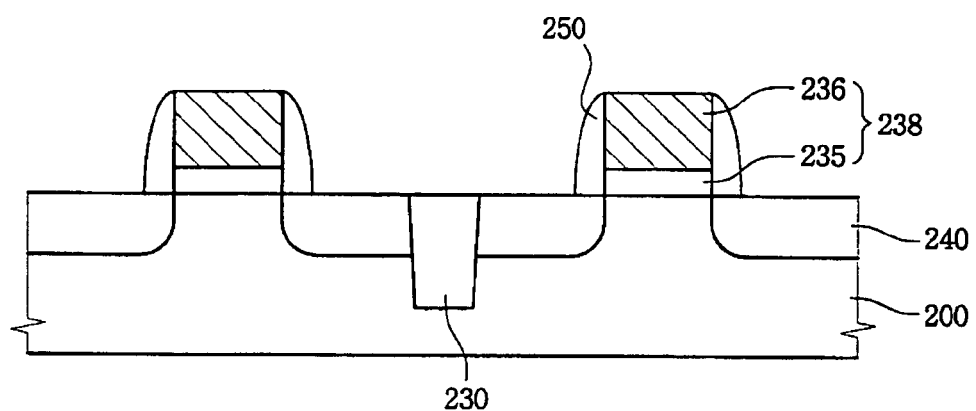
FIGS. 2B to 2J are cross sectional views illustrating a method of forming a semiconductor device taken along a line of A–A' in FIG. 2A.

Referring to FIG. 2B, a plurality of active and field regions were defined on the semiconductor substrate 200 according to the formation of the trench oxide film 230 as described above.

After an oxide film was formed on the substrate 200 including the field and active regions, a polysilicon film was formed on the oxide film. The polysilicon film was doped with impurities to have a high impurity concentration. The doped polysilicon film and the oxide film were successively patterned using a photolithography process to form the gate electrodes 238 including gate oxide film patterns 235 and doped polysilicon film patterns 236. Here, a gap between the gate electrodes 238 was about 20 nm.

Source/drain regions 240 were formed at portions of the substrate 200 by an ion implantation process using the gate electrodes 238 as masks. Thus, transistors including the gate electrodes 238 and the source/drain regions 240 were formed on the substrate 200.

After a silicon nitride film was formed on the gate electrodes 238 and on the substrate 200, the silicon nitride film was anisotropically etched to form gate spacers 250 on sidewalls of the gate electrodes 238.

Figure 3A:
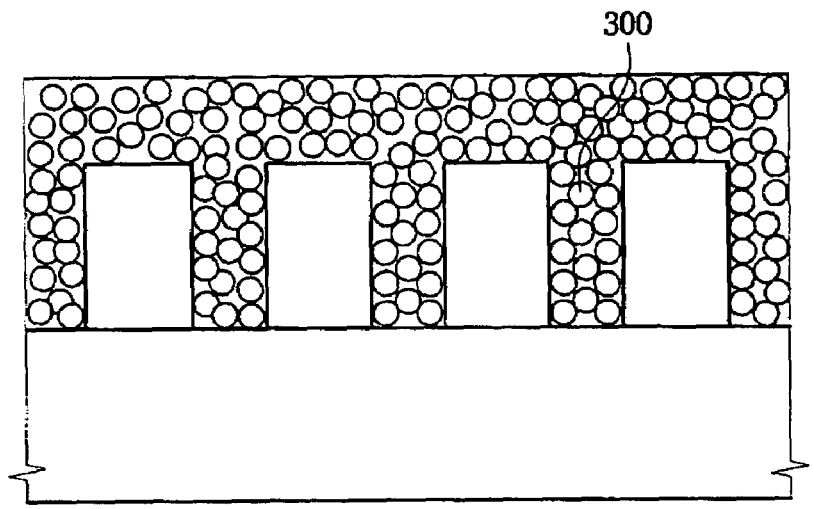
FIG. 3A is a schematic cross sectional view illustrating a step of filling a gap between transistors in accordance with one embodiment of the present invention.

FIG. 3A is a schematic cross sectional view illustrating a step of filling a gap between the transistors in accordance with embodiments of the present invention.

Figure 2C:
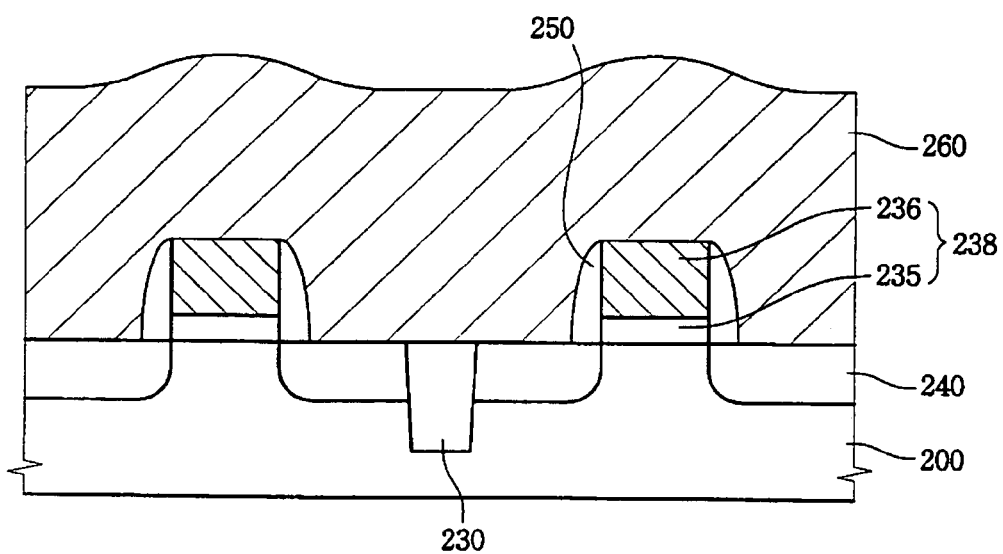

Referring to FIGS. 2C and 3A, a second film 260 was formed on the substrate 200 having the transistors formed thereon using the above-described solution. Here, perhydro-polysilazane 300 having low molecular weight had an average molecular size of below about 2 nm. Since the ratio between the gap between transistors and the average molecular size of perhydro-polysilazane 300 having low molecular weight was above about 10:1, perhydro-polysilazane 300 having low molecular weight was sufficiently inserted in the gap between the transistors, thereby completely filling the gap between the transistors. Particularly, because perhydro-polysilazane 300 having low molecular weight had a molecular weight distribution of about 2.2, the gap between the transistors was effectively filled without voids as perhydro-polysilazane molecules having relatively small sizes were sufficiently inserted between perhydro-polysilazane molecules having relatively large sizes.

Figure 2D:
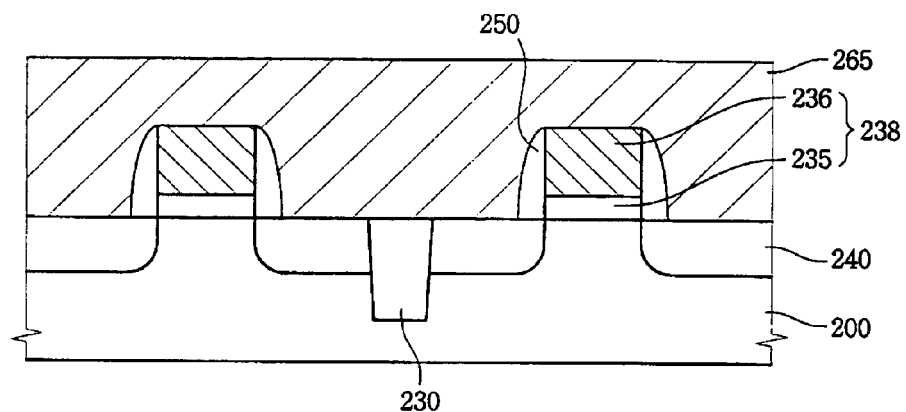

Referring to FIG. 2D, the second film 260 was hardened using an oxidizing gas to form a second oxide film. Here, the second oxide film was dense, and had reduced height relative to the second film 260 because the second film 260 was diminished during hardening. Hence, the second oxide film densely filled up the gap between the transistors.

The second oxide film was planarized using a chemical mechanical polishing (CMP) process, thereby forming a first interlayer insulation film 265 on the substrate 200 to cover the gate electrodes 238.

Figure 2E:
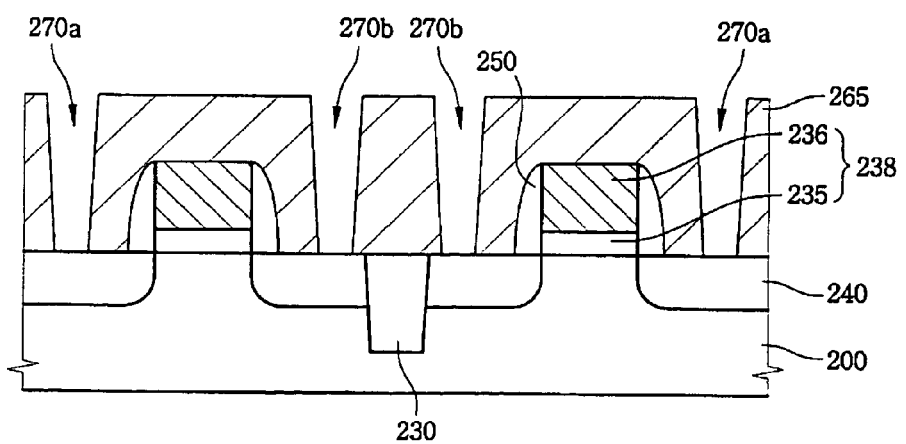

Referring to FIG. 2E, a photoresist film was coated on the first interlayer insulation film 265, and then a photoresist pattern exposing portions of the first interlayer insulation film 265 was formed on the interlayer insulation film 265. The exposed portions of the first interlayer insulation film 265 were etched using the photoresist pattern as an etching mask to thereby form the first contact holes 270a and the second contact holes 270b. The substrate 200 including the first and second holes 270a and 270b was cleaned so as to remove impurities or particles existing in the first and second contact holes 270a and 270b. Here, the first interlayer insulation film 265 was not damaged during the cleaning process because the first interlayer insulation film 265 had a dense construction.

Figure 2F:
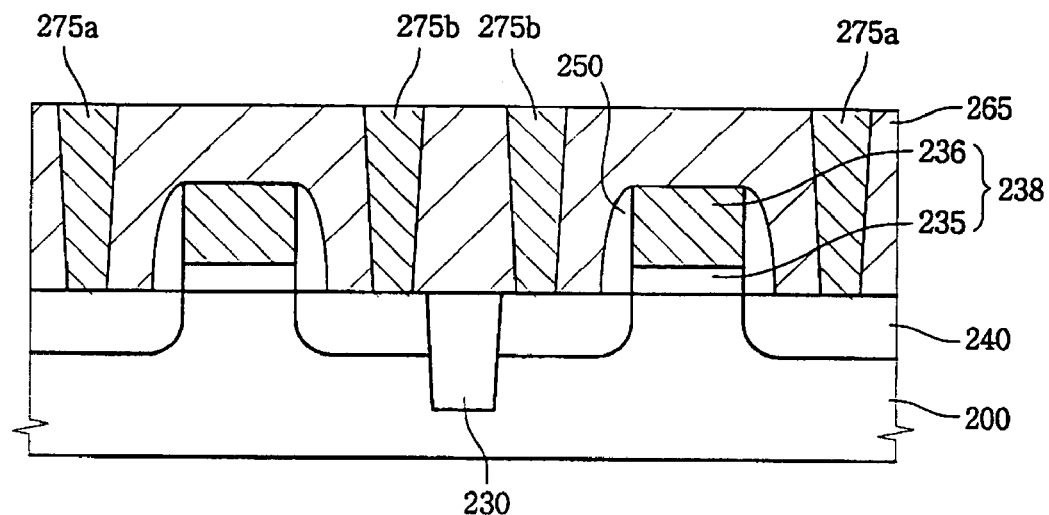

Referring to FIG. 2F, a conductive film was formed on the first interlayer insulation film 265 to fill up the first and second contact holes 270a and 270b. The conductive film was removed using a CMP process until the upper face of the first interlayer insulation film 265 was exposed. Thus, first and second contact plugs 275a and 275b were formed in the first and second contact holes 270a and 270b, respectively.

Figure 2G:
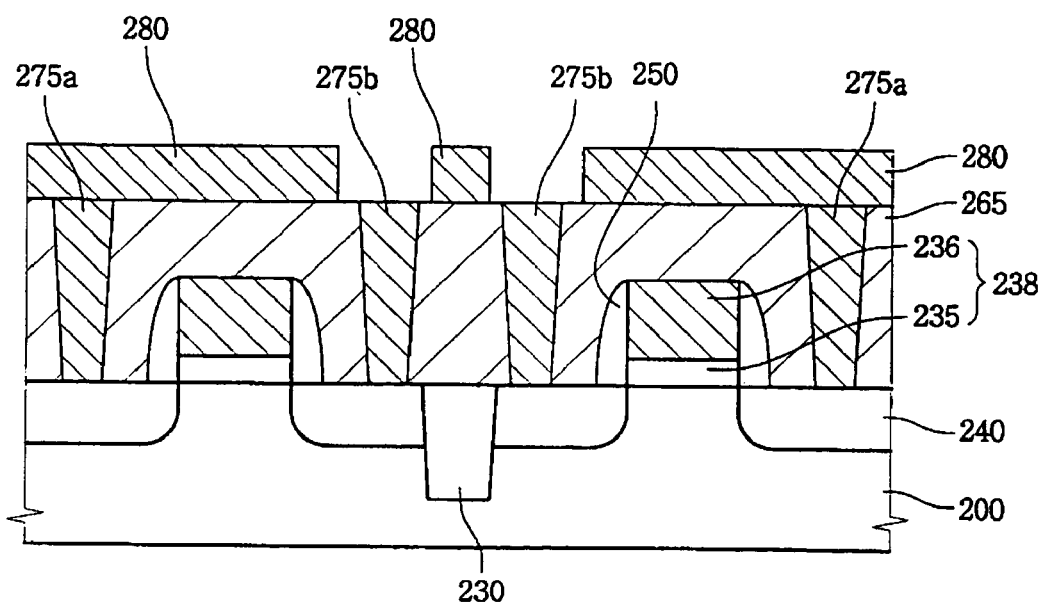

Referring to FIG. 2G, after a metal film was formed on the first interlayer insulation film 265 including the first and second contact plugs 275a and 275b, bit lines 280 were formed on the first contact plugs 275a and on the first interlayer insulation film 265 by patterning the metal film.

Figure 2H:
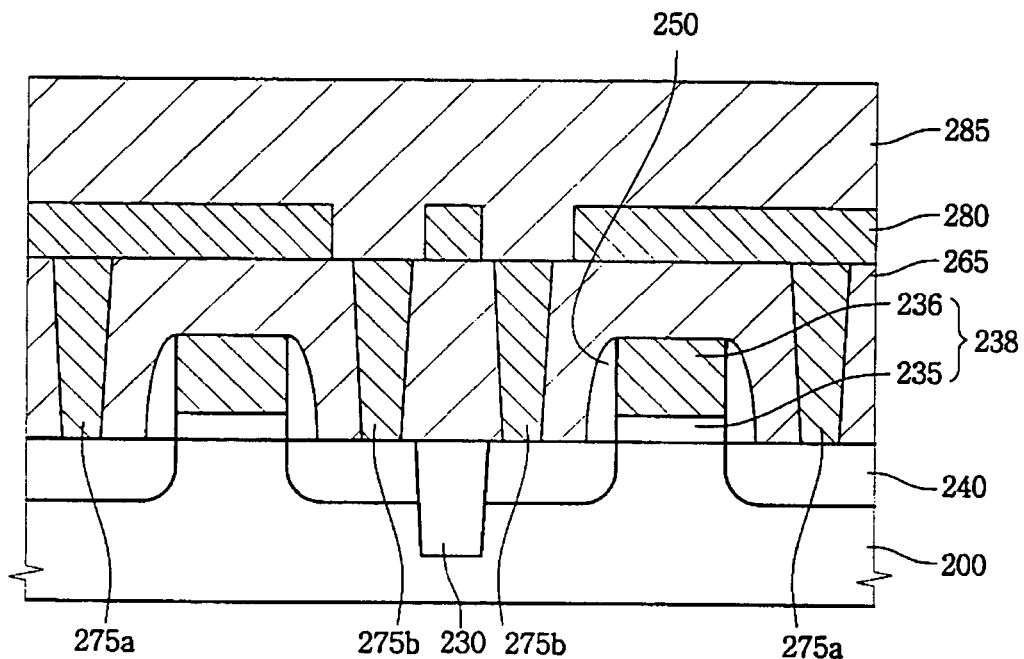

Referring to FIG. 2H, a third film was formed on the bit lines 280, on the second contact plugs 275b and on the first interlayer insulation film 265 using the above-described composition that comprises perhydro-polysilazane having low molecular weight. The bit lines 280 were completely covered with the third film. The third film was hardened using an oxidizing gas to thereby form a second interlayer insulation film 285 on the bit lines 280, on the second contact plugs 275b and on the first interlayer insulation film 265. Alternatively, the second interlayer insulation film 285 might be formed using insulation material such as oxides or nitrides.

Figure 2I:
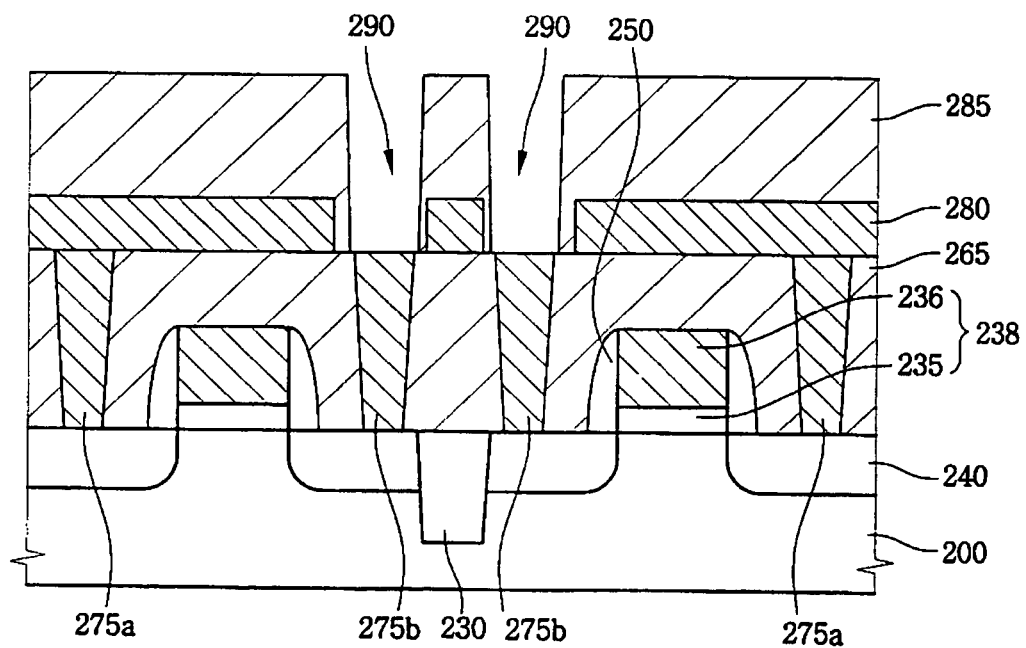

Referring to FIG. 2I, portions of the second interlayer insulation film 285 were etched to form third contact holes 290 exposing the second contact plugs 275b. To remove impurities or particles generated during etching the second interlayer insulation film 285, a cleaning process was carried out on the substrate 200 including the third contact holes 290.

Figure 2J:
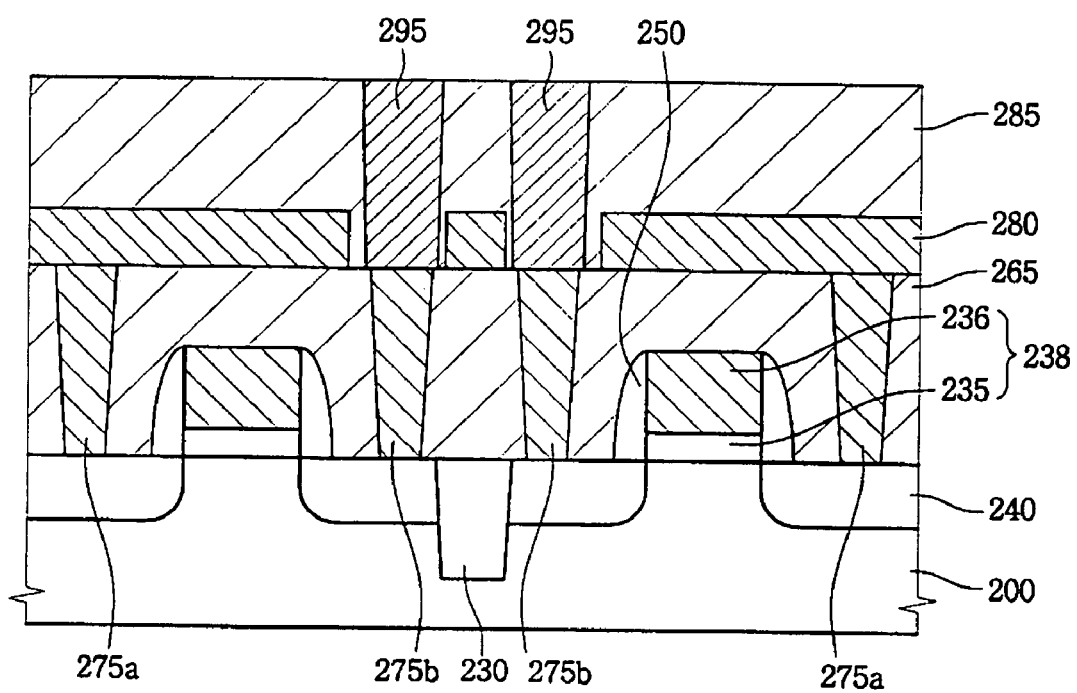

Referring to FIG. 2J, after a conductive film was formed on the second interlayer insulation film 290 to fill up the third contact holes 290, the conductive film was removed until the second interlayer insulation film 290 was exposed to thereby form third contact plugs 295 in the third contact holes 290. The third contact plugs 295 were contacted to the second contact plugs 275b, respectively.

COMPARATIVE EXAMPLE 2

Figure 4A:
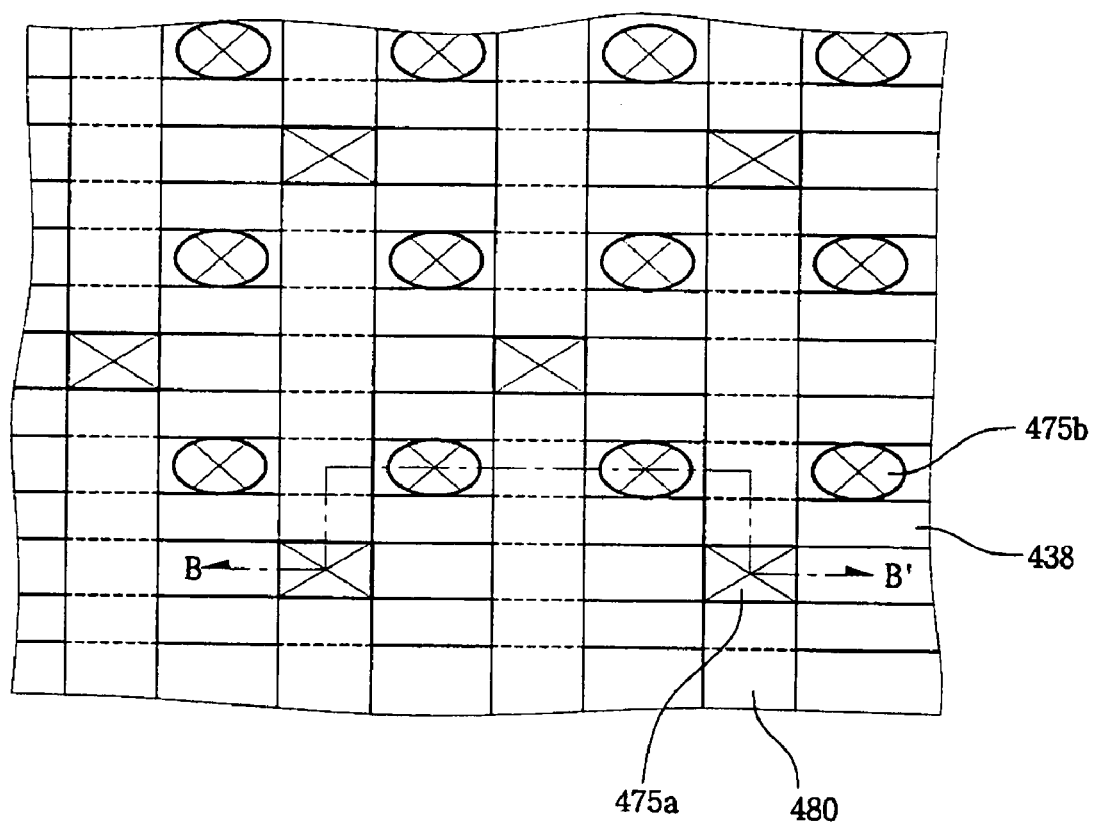
FIG. 4A is a schematic plan view illustrating a semiconductor device according to an embodiment example of the present invention.

FIG. 4A is a schematic plan view illustrating a semiconductor device according to one comparative example of the present invention.

Referring to FIG. 4A, a gate line (gate electrodes) 438 was formed on a semiconductor substrate in a first direction, and a bit line 480 was formed on the substrate in a second direction perpendicular to the first direction.

The bit line 480 included bit line contact plugs (first contact plugs) 475a making contact with underlying first contact regions of the substrate. In addition, second contact plugs 475b making contact with second contact regions of the substrate were formed for capacitors successively formed.

FIGS. 4B to 4J are cross sectional views illustrating a method of forming the semiconductor device taken along line of B–B' in FIG. 4A.

Figure 4B:
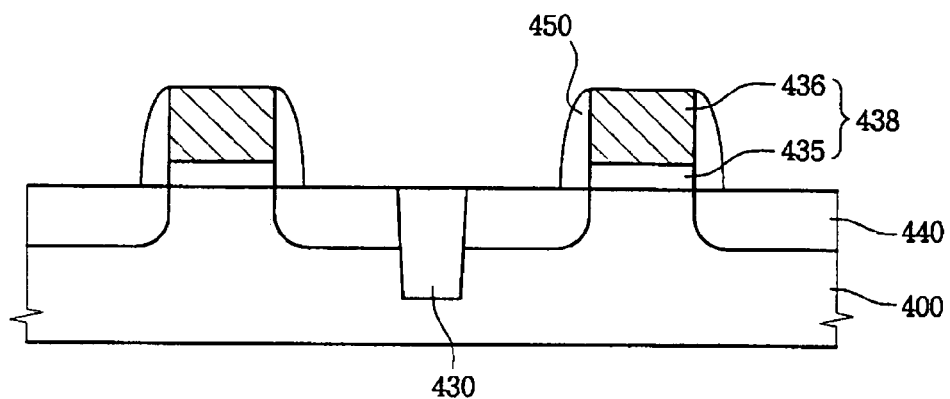
FIGS. 4B to 4J are cross sectional views illustrating a method of forming a semiconductor device taken along line of B–B' in FIG. 4A.

Referring to FIG. 4B, after a trench was formed on a semiconductor substrate 400 by a shallow trench isolation (STI) process, a field region 430 was defined on the semiconductor substrate 400 by filling an oxide film in the trench. The field region 430 is formed using the above-described composition and method. Also, active regions were formed on the substrate 400 in accordance with the formation of the field region 430.

An oxide film was formed on the substrate 400 where the field region 430 and the active regions were defined, and then a polysilicon film was formed on the oxide film. The polysilicon film was doped with impurities to have a high impurity concentration. The doped polysilicon film and the oxide film were patterned by a photolithography process to thereby form gate electrodes 438 including doped polysilicon patterns 436 and gate oxide film patterns 435. A gap between the gate electrodes 438 was about 20 nm.

Source/drain regions 440 were formed at portions of the substrate 400 by an ion implantation process using the gate electrodes 438 as masks. Hence, transistors including the gate electrodes 438 and the source/drain regions 440 were formed on the substrate 400.

After an insulation film such as a silicon nitride film or a silicon oxide film was formed on the gate electrodes 438 and on the substrate 400, the insulation film was anisotropically etched to form gate spacers 450 on sidewalls of the gate electrodes 438.

Figure 3B:
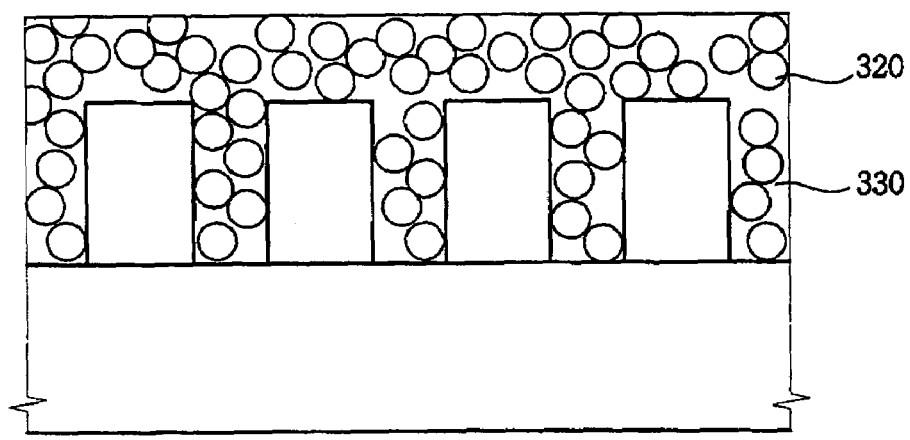

FIG. 3B is a schematic cross sectional view illustrating a step of filling a gap between the transistors in accordance with a comparative example of the present invention.

Figure 4C:
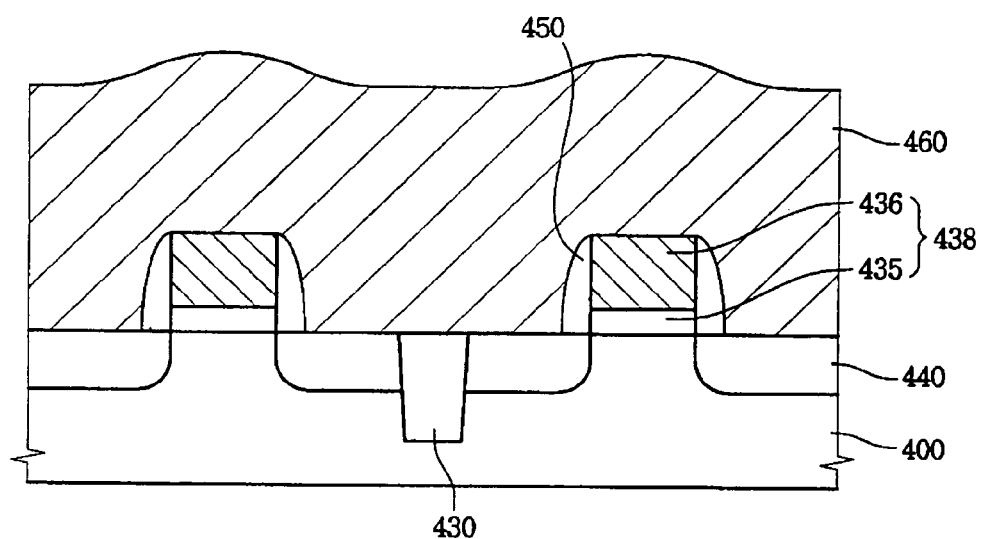

Referring to FIGS. 3B and 4C, a spin on glass (SOG) film 460 was formed on the substrate 400 having the transistors formed thereon using a solution comprising a perhydro-polysilazane of high molecular weight and a solvent. Here, perhydro-polysilazane 320 having high molecular weight had an average molecular size of above about 4 nm. The ratio between the gap between transistors and the average molecular size of perhydro-polysilazane 320 of high molecular weight was below about 5:1. When perhydro-polysilazane 320 having high molecular weight was provided on the substrate 400, perhydro-polysilazane 320 might not effectively occupy the gap between the transistors because perhydro-polysilazane 320 of high molecular weight had a relative large size. Thus, perhydro-polysilazane 320 of high molecular weight results in the formation of pores in the gap between the transistors. Furthermore, the SOG film 460 was not dense between the transistors because various sized particles of perhydro-polysilazane 320 having high molecular weight were not evenly distributed in the gap between the transistors although perhydro-polysilazane 320 of high molecular weight had the polydispersity index of about 3.1. Portions of the SOG film 460 did not have high or uniform density due to the size of perhydro-polysilazane 320 of high molecular weight. As a result, pores 330 were formed in the gap between the transistors.

Figure 4D:
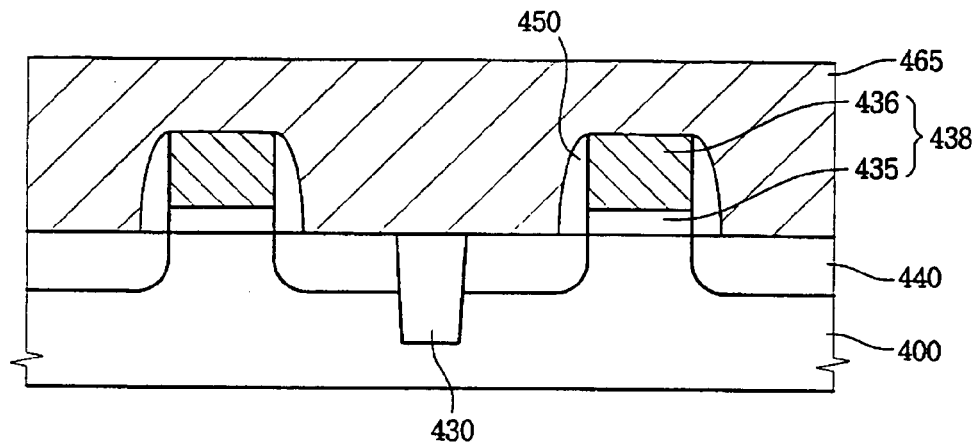

Referring to FIG. 4D, the SOG film 460 was changed into an oxide film by hardening the SOG film 460 and providing an oxidizing gas such as an oxygen gas and a water vapor. Here, the second oxide film had reduced height relative to the SOG film 460 because the SOG film 460 was diminished during hardening.

The oxide film was planarized using a CMP process to thereby form a first interlayer insulation film 465 on the substrate 400.

Figure 4E:
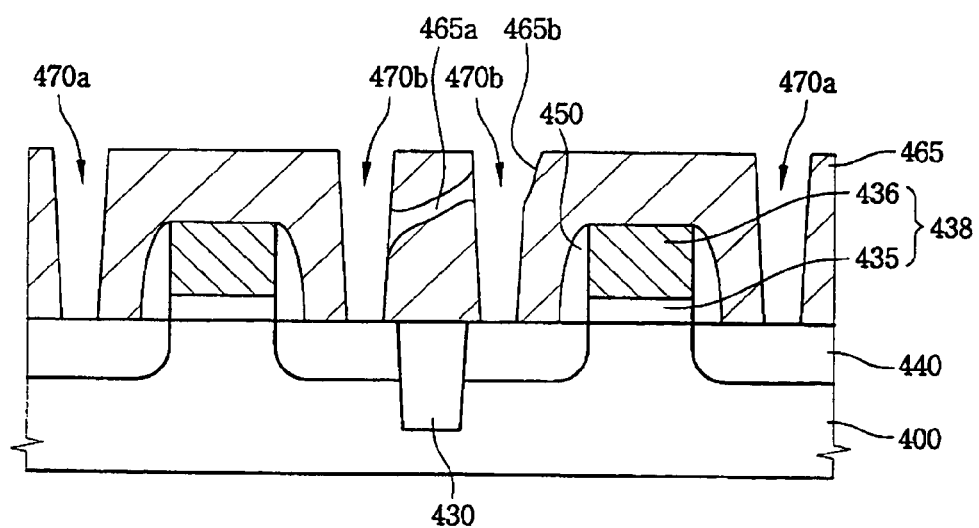

Referring to FIG. 4E, a photoresist film was coated on the first interlayer insulation film 465, and then a photoresist pattern exposing portions of the first interlayer insulation film 465 was formed on the interlayer insulation film 465. The exposed portions of the first interlayer insulation film 465 were etched using the photoresist pattern as an etching mask to thereby form the first contact holes 470a and the second contact holes 470b. The substrate 400 including the first and second holes 470a and 470b was cleaned so as to remove impurities or particles existing in the first and second contact holes 470a and 470b. Here, the first interlayer insulation film 465 was not dense except porous film since the first interlayer insulation film 465 was formed using perhydro-polysilazane of high molecular weight. Therefore, the first interlayer insulation film 465 was damaged during the cleaning process so that an etched portion 465b exposing conductive patterns such as the gate electrodes 438 was formed. Further, the first interlayer insulation film 465 was damaged to generate a passage 465a that connects adjacent contact holes 470b.

Figure 4F:
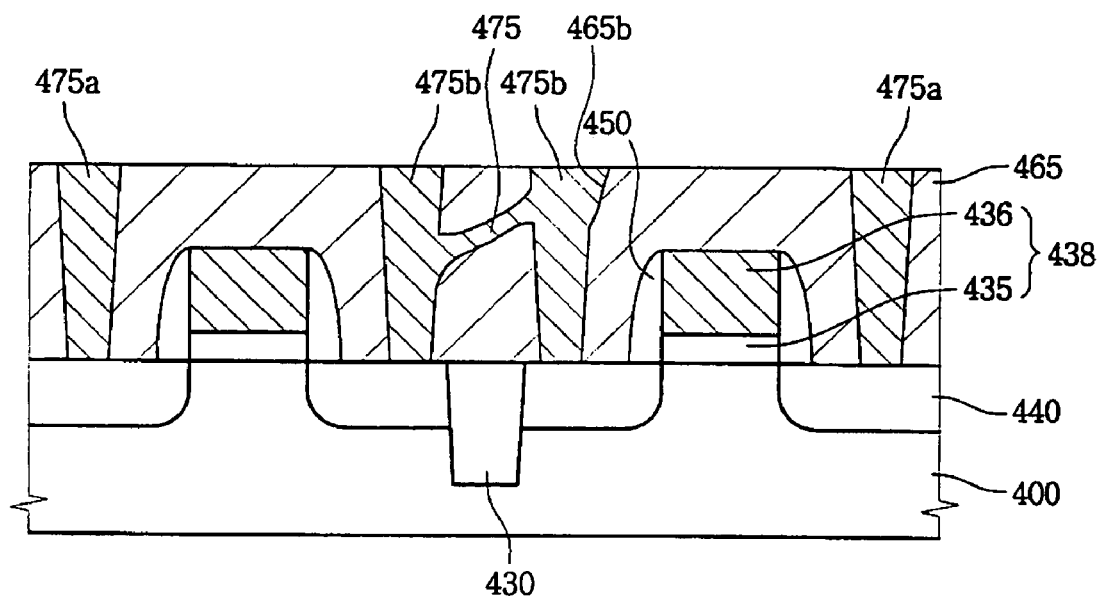

Referring to FIG. 4F, a conductive film was formed on the first interlayer insulation film 465 to fill the first and second contact holes 470a and 470b. The conductive film was removed using a CMP process until the upper face of the first interlayer insulation film 265 was exposed. Thus, first and second contact plugs 475a and 475b were formed in the first and second contact holes 470a and 470b, respectively. Here, adjacent first contact plugs 475a or second contact plugs 475b were connected to each other through a bridge 475 formed in the passage 465a formed due to the damage of the first interlayer insulation film 465. This bridge 475 might cause an electrical short between adjacent contact plugs 475a or 475b. Hence, the failure of the semiconductor device might be caused due to the bridge 475.

Figure 4G:
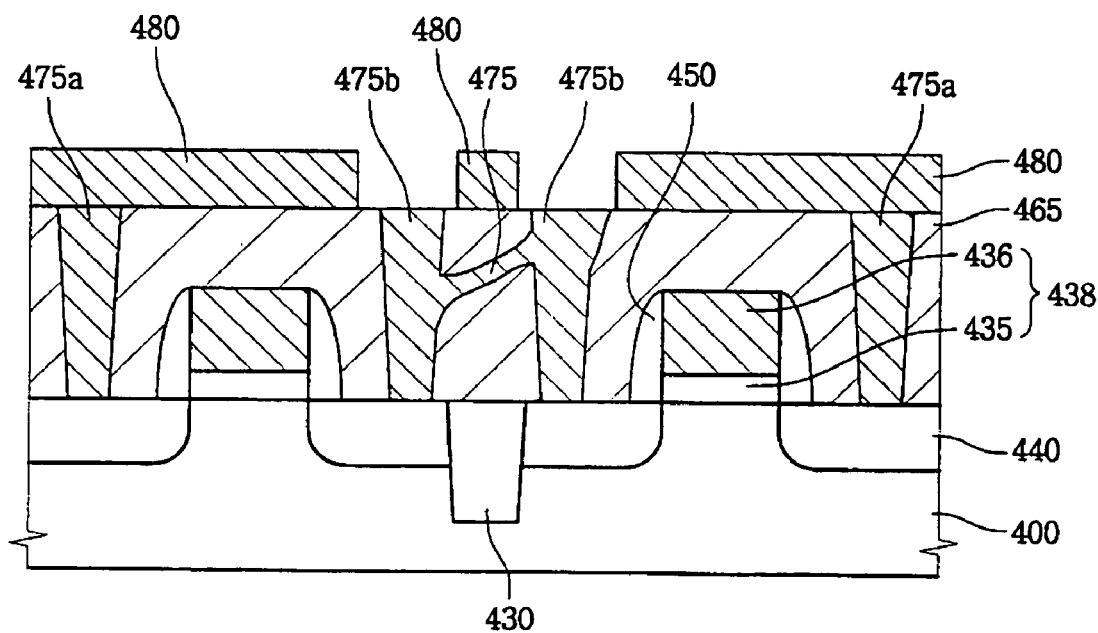

Referring to FIG. 4G, after a metal film was formed on the first interlayer insulation film 465 including the first and second contact plugs 475a and 475b, bit lines 480 were formed on the first contact plugs 475a and on the first interlayer insulation film 465 by patterning the metal film.

Figure 4H:
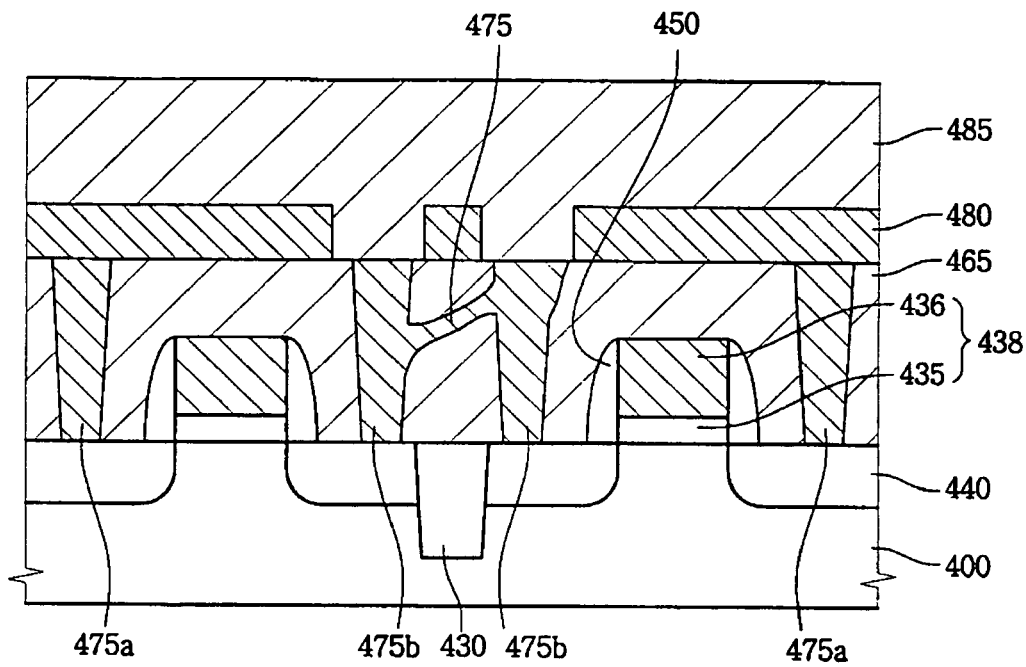

Referring to FIG. 4H, a film was formed on the bit lines 480, on the second contact plugs 475b and on the first interlayer insulation film 465 using the above-described compositions that comprise perhydro-polysilazane having high molecular weight. The film was hardened using an oxidizing gas to thereby form a second interlayer insulation film 485 on the bit lines 480, on the second contact plugs 475b and on the first interlayer insulation film 465.

Figure 4I:
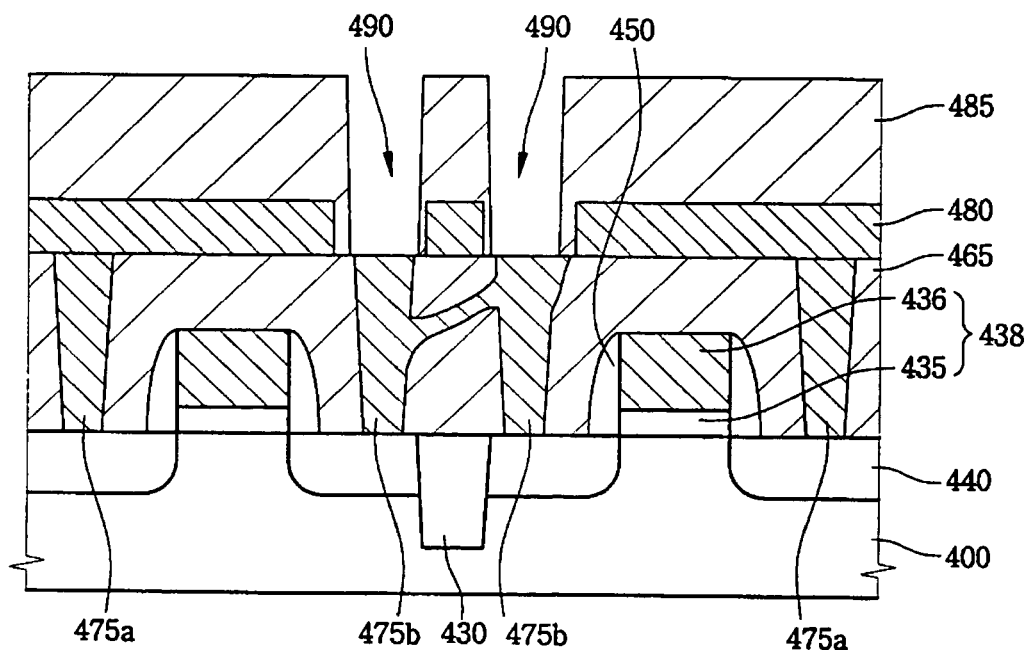

Referring to FIG. 4I, portions of the second interlayer insulation film 485 were etched to form third contact holes 490 exposing the second contact plugs 475b. To remove impurities or particles generated during etching the second interlayer insulation film 485, a cleaning process was carried out on the substrate 400 including the third contact holes 490.

Figure 4J:
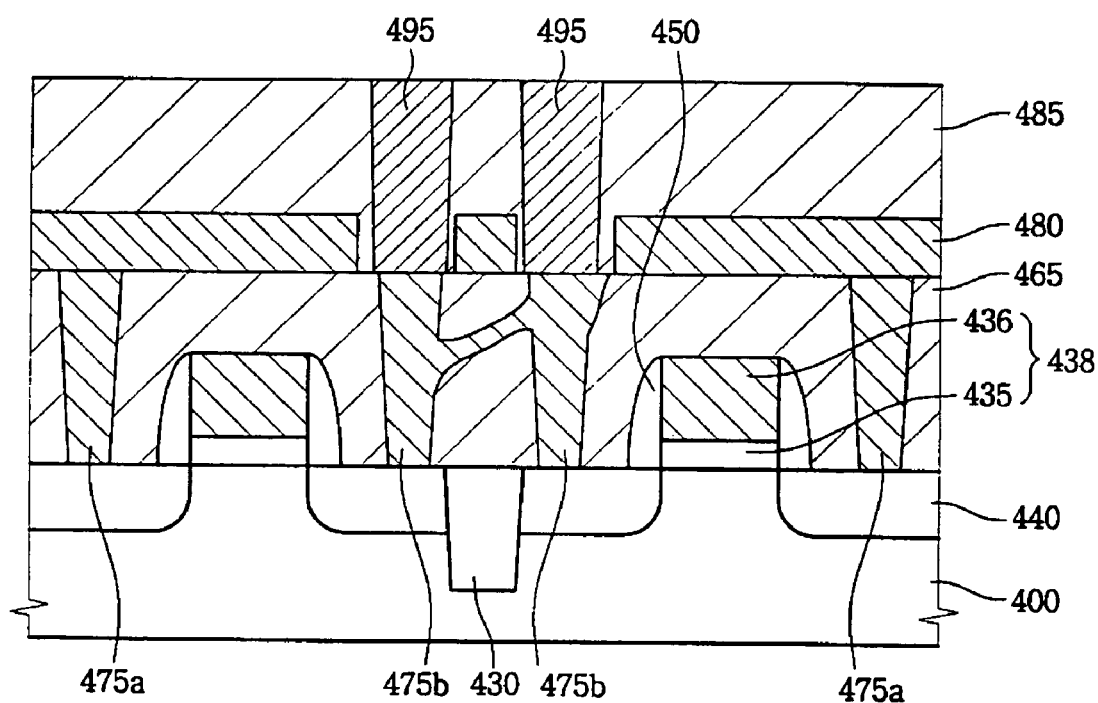

Referring to FIG. 4J, after a conductive film was formed on the second interlayer insulation film 490 to fill the third contact holes 490, the conductive film was removed until the second interlayer insulation film 490 was exposed to thereby form third contact plugs 495 in the third contact holes 490. The third contact plugs 495 were contacted to the second contact plugs 475b, respectively.

Figure 5A:
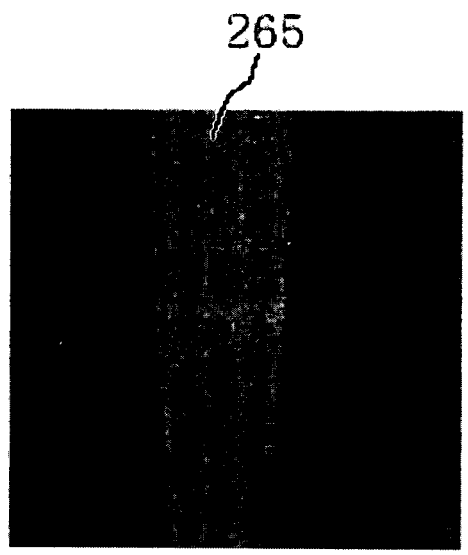
FIG. 5A is a cross sectional photo illustrating a first interlayer insulation film obtained using a transmission electron microscope (TEM) according to one embodiment of the present invention.
Figure 5B:
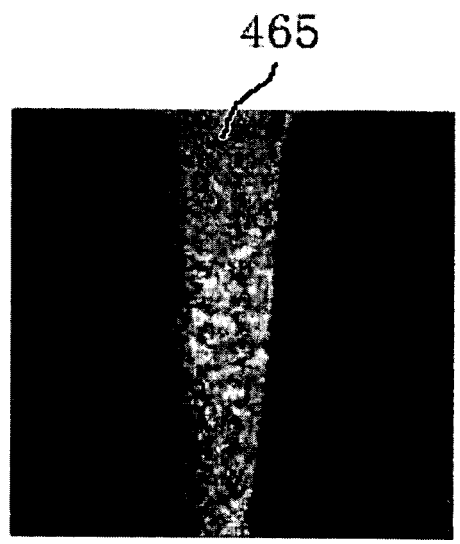
FIG. 5B is a cross sectional photo illustrating a first interlayer insulation film obtained using a TEM according to one comparative example of the present invention.

FIG. 5A is a cross sectional photograph illustrating the first interlayer insulation film obtained using a transmission electron microscope (TEM) according to example 2 of the present invention, and FIG. 5B is a cross sectional photo illustrating the first interlayer insulation film obtained using a TEM according to comparative example 2 of the present invention.

Referring to FIG. 5A, because the first interlayer insulation film 265 was formed using perhydro-polisilazane 300 having low molecular weight and the average molecular size of about 2 nm that completely filled in the gap between the transistors, the first interlayer insulation film 265 was dense and uniform. Further, perhydro-polisilazane 300 of low molecular weight had the polydispersity index of about 2.2 so that relatively small particles of perhydro-polisilazane 300 of low molecular weight were effectively inserted between relatively large particles of perhydro-polisilazane 300 of low molecular weight. Thus, the first interlayer insulation film 265 was dense and durable for the cleaning process.

Referring to FIG. 5B, the first interlayer insulation film 465 was not dense as well as not uniform because the first interlayer insulation film 465 was formed using perhydro-polisilazane 320 having high molecular weight and an average molecular size of about 4 nm, which does not sufficiently fill the gap between the transistors. In addition, perhydro-polisilazane 320 of high molecular weight had a polydispersity index of about 3.1 so that the first interlayer insulation film 465 was porous and weak for the cleaning process.

Figure 6:
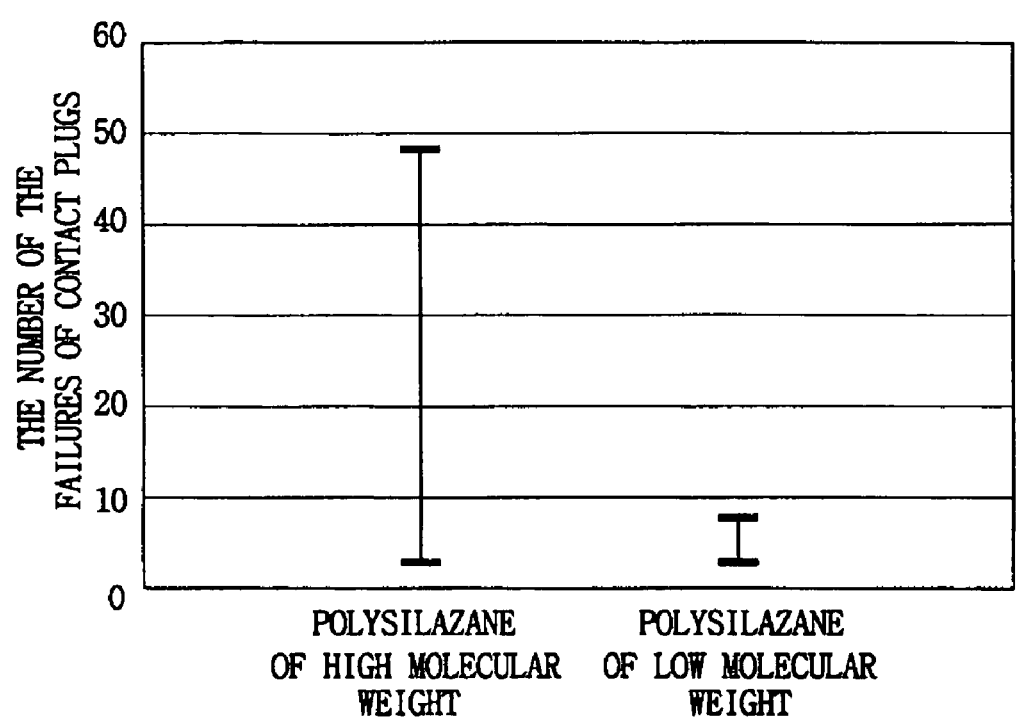
FIG. 6 is a graph illustrating the number of bit fails generated in a semiconductor device of 256M in accordance with an embodiment and a comparative example of the present invention.

FIG. 6 is a graph illustrating the number of bit-fails generated in semiconductor devices of 256M in accordance with Example 2 and comparative Example 2 of the present invention.

As shown in FIG. 6, the number of failed contact plugs in the semiconductors of 256M was measured. Here, the semiconductors were formed on one wafer. In semiconductor devices manufactured according to Example 2 of the present invention, the number of the failed contact plugs was about 5. However, in the semiconductor devices manufactured according to comparative Example 2, the maximum number of the failed contact plugs was about 50 while the minimum number of the failure of the contact plugs was about 5. Thus, the reliability of the semiconductor manufacturing process was deteriorated when the semiconductor devices were manufactured in accordance with the Comparative Examples.

As described above, a highly dense film is obtained using perhydro-polysilazane having low molecular weight because perhydro-polysilazane of low molecular weight is completely filled into a narrow gap between conductive patterns formed on a substrate. Since perhydro-polysilazane of low molecular weight has good solubility relative to a solvent such as xylene or dibutyl ether, the gellation of perhydro-polysilazane of low molecular weight is not generated in a solution, and particles or impurities in the solution are reduced. When perhydro-polysilazane has low molecular weight of about 1,800, perhydro-polysilazane of low molecular weight has an average molecular size of about 2 nm. Therefore, a dense and uniform film is formed using perhydro-polysilazane of low molecular weight without the generation of pores or voids. However, when a film is obtained using perhydro-polysilazane of high molecular weight, the film is porous, but it is not uniform.

When the film formed using perhydro-polysilazane of low molecular weight is employed as an interlayer insulation film of a semiconductor device, a failure such as an electrical short between adjacent contact plugs is greatly reduced, thus improving the reliability of a semiconductor manufacturing process.

According to the embodiments of present invention, semiconductor devices are manufactured using compositions including perhydro-polysilazane of low molecular weight having weight average molecular weight of about 300 to about 3,000 and polydispersity index of about 1.8 to about 3.0. Thus, a dense and uniform film of the semiconductor device can be formed using the compositions including perhydro-polysilazane having low molecular weight and small molecular weight distribution. When this film is employed for an interlayer insulation film of the semiconductor device, the interlayer insulation film is not etched during a cleaning process so that contact holes formed through the interlayer insulation film are completely separated from each other. As a result, contact plugs formed in the contact holes are completely insulated from each other, thereby improving the reliability of the semiconductor device.

Having described the embodiments for the methods and the apparatus for classifying defects, it is noted that modifications and variations can be made by persons skilled in the art in light of the above teachings. It is therefore to be understood that changes may be made in the particular embodiments of the present invention disclosed without departing from the scope and the spirit of the invention as defined by the appended claims, and their equivalents.

That which is claimed is:

1. A method of forming a film in a semiconductor manufacturing process, comprising forming the film on a substrate to cover at least a portion of the substrate using a solution comprising a solvent and perhydro-polysilazane, wherein the perhydro-polysilazane has a weight average molecular weight of about 300 to about 3,000 and a polydispersity index of about 1.8 to about 3.0 according to the formula:

—(SiH$_2$NH)$_n$— wherein n is a positive integer.

2. The method of claim 1, wherein the solution comprises about 5 to about 30 percent by weight perhydro-polysilazane, and about 70 to about 95 percent by weight solvent.

3. The method of claim 1, wherein the solvent comprises xylene or dibutyl ether.

4. The method of claim 1, wherein the film is formed by a spin coating process.

5. The method of claim 1, further comprising changing the film into a silicon oxide film by heating the film and by providing an oxidizing gas to the film.

6. The method of claim 5, wherein the film is heated at a temperature of above about 600° C.

7. The method of claim 5, wherein the oxidizing gas comprises an oxygen gas or a water vapor.

8. A method of manufacturing a semiconductor device, comprising:
  forming a plurality of first conductive patterns on a substrate where an active region and a field region are defined;
  forming a first film on the substrate to fill gaps between the first conductive patterns using a solution that comprises a solvent and perhydro-polysilazane, wherein the perhydro-polysilazane has a weight average molecular weight of about 300 to about 3,000 and a polydispersity index of about 1.8 to about 3.0 according to the formula:

—(SiH$_2$NH)$_n$— wherein n is a positive integer;
  forming a first silicon oxide film from the first film by heating the first film and providing a first oxidizing gas to the first film;
  forming a first opening exposing the active region by partially etching the first silicon oxide film; and
  forming a first contact in the first opening by filling the first opening with a conductive material.

9. The method of claim 8, wherein the first oxidizing gas comprises an oxygen gas or a water vapor, and the first film is heated at a temperature of above about 600° C.

10. The method of claim 8, further comprising prior to forming the first conductive patterns:
  forming a trench on the substrate;
  forming a second film on the substrate to fill the trench using a solution that comprises a solvent and perhydro-polysilazane having a weight average molecular weight of about 300 to about 3,000 and a polydispersity index of about 1.8 to about 3.0 according to the formula:

—(SiH$_2$NH)$_n$— wherein n is a positive integer;
  forming a second silicon oxide film from the second film by heating the second film and by providing a second oxidizing gas to the second film; and
  forming a trench oxide film in the trench by removing a portion of the second silicon oxide film existing on the substrate.

11. The method of claim 10, wherein the second oxidizing gas comprises an oxygen gas or a water vapor, and the second film is heated at a temperature of above about 600° C.

12. The method of claim 8, further comprising cleaning the first opening after forming the first opening.

13. The method of claim 8, further comprising:
  forming a second conductive pattern making contact with the first contact;
  forming a third film on the substrate and the second conductive pattern using a solution that comprises a solvent and perhydro-polysilazane, wherein the perhydro-polysilazane has a weight average molecular weight of about 300 to about 3,000 and a polydispersity index of about 1.8 to about 3.0 according to the formula:

—(SiH$_2$NH)$_n$— wherein n is a positive integer;
  forming a third silicon oxide film from the third film by heating the third film and providing an third oxidizing gas to the third film;
  forming a second opening exposing a portion of the substrate by partially etching the third silicon oxide film and the first silicon oxide film; and
  forming a second contact in the second opening by filling the second opening with a conductive material.

14. The method of claim 13, wherein the third oxidizing gas comprises an oxygen gas or a water vapor, and the third film is heated at a temperature of above about 600° C.

15. The method of claim 13, further comprising cleaning the second opening after forming the second opening.

16. The method of claim 8, wherein a gap between the first conductive patterns is less than about 20 nm.

17. The method of claim 16, wherein a ratio between the size of the gap and the average molecular size of perhydro-polysilazane is above about 5:1.

* * * * *